(12) United States Patent
Lai et al.

(10) Patent No.: US 10,361,134 B2
(45) Date of Patent: Jul. 23, 2019

(54) METHOD FOR LITHOGRAPHIC PROCESS AND LITHOGRAPHIC SYSTEM

(71) Applicant: Taiwan Semiconductor Manufacturing Co., Ltd., Hsinchu (TW)

(72) Inventors: Wei-Chih Lai, Changhua County (TW); Li-Kai Cheng, New Taipei (TW); Shun-Jung Chen, Hsinchu (TW); Bo-Tsun Liu, Taipei (TW); Han-Lung Chang, Kaohsiung (TW); Tzung-Chi Fu, Miaoli (TW); Li-Jui Chen, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/800,568

(22) Filed: Nov. 1, 2017

(65) Prior Publication Data

US 2019/0067132 A1    Feb. 28, 2019

Related U.S. Application Data

(60) Provisional application No. 62/551,825, filed on Aug. 30, 2017.

(51) Int. Cl.
*G03B 27/52* (2006.01)
*H01L 21/66* (2006.01)
(Continued)

(52) U.S. Cl.
CPC ............ *H01L 22/12* (2013.01); *G03F 7/2004* (2013.01); *H01L 21/0274* (2013.01);
(Continued)

(58) Field of Classification Search
CPC ... G03F 7/70641; G03F 9/7026; G01B 13/02; G01B 13/03; G01B 13/065; G01B 13/12
See application file for complete search history.

(56) References Cited

U.S. PATENT DOCUMENTS 4,650,983 A *  3/1987  Suwa .................... G03F 9/7026
                                                      250/204
8,764,995 B2  7/2014  Chang et al.
(Continued)

FOREIGN PATENT DOCUMENTS

WO    WO-2016063743 A1 *  4/2016  ............... G03F 7/40

*Primary Examiner* — Peter B Kim
(74) *Attorney, Agent, or Firm* — McClure, Qualey & Rodack, LLP

(57) ABSTRACT

A method for performing a lithographic process over a semiconductor wafer is provided. The method includes coating a photoresist layer over a material layer which is formed on the semiconductor wafer in a track apparatus. The method further includes transferring the semiconductor wafer from the track apparatus to an exposure apparatus. The method also includes measuring a height of the photoresist layer before the removal of the semiconductor wafer from the track apparatus. In addition, the method includes measuring height of the material layer in the exposure apparatus. The method also includes determining a focal length for exposing the semiconductor wafer according to the height of the photoresist layer and the height of the material layer.

20 Claims, 7 Drawing Sheets

(51) Int. Cl.
  *H01L 21/027* (2006.01)
  *G03F 7/20* (2006.01)
  *H01L 21/67* (2006.01)

(52) U.S. Cl.
  CPC .. *H01L 21/67103* (2013.01); *H01L 21/67109* (2013.01); *H01L 21/67173* (2013.01); *H01L 21/67225* (2013.01); *H01L 21/67253* (2013.01); *H01L 21/67288* (2013.01); *H01L 21/6715* (2013.01)

(56) References Cited

U.S. PATENT DOCUMENTS

| | | |
|---|---|---|
| 8,796,666 B1 | 8/2014 | Huang et al. |
| 8,828,625 B2 | 9/2014 | Lu et al. |
| 8,841,047 B2 | 9/2014 | Yu et al. |
| 8,877,409 B2 | 11/2014 | Hsu et al. |
| 9,093,530 B2 | 7/2015 | Huang et al. |
| 9,184,054 B1 | 11/2015 | Huang et al. |
| 9,256,123 B2 | 2/2016 | Shih et al. |
| 9,529,268 B2 | 12/2016 | Chang et al. |
| 9,548,303 B2 | 1/2017 | Lee et al. |
| 2014/0347644 A1* | 11/2014 | Wu .................. G03F 7/70141 355/55 |
| 2017/0336711 A1* | 11/2017 | Yamada ............. H01L 21/027 |

\* cited by examiner

METHOD FOR LITHOGRAPHIC PROCESS AND LITHOGRAPHIC SYSTEM

PRIORITY CLAIM AND CROSS-REFERENCE

This application claims the benefit of U.S. Provisional Application No. 62/551,825, filed on Aug. 30, 2017, the entirety of which is incorporated by reference herein.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs. Such scaling-down has also increased the complexity of processing and manufacturing ICs.

A lithography exposing process forms a patterned photoresist layer for various patterning processes, such as etching or ion implantation. In a typical lithography process, a photosensitive layer (resist) is applied to a surface of a semiconductor substrate, and an image of features defining parts of the semiconductor device is provided on the layer by exposing the layer to a pattern of radiation. As semiconductor processes evolve to provide for smaller critical dimensions, and devices reduce in size and increase in complexity including number of layers, a way of accurately patterning the features is in order to improve the quality, reliability, and yield of the devices.

Although numerous improvements to perform the lithography exposing process have been invented, they have not been entirely satisfactory in all respects. Consequently, it would be desirable to provide a solution to improve the lithographic system so as to increase the production yield of the semiconductor wafers.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
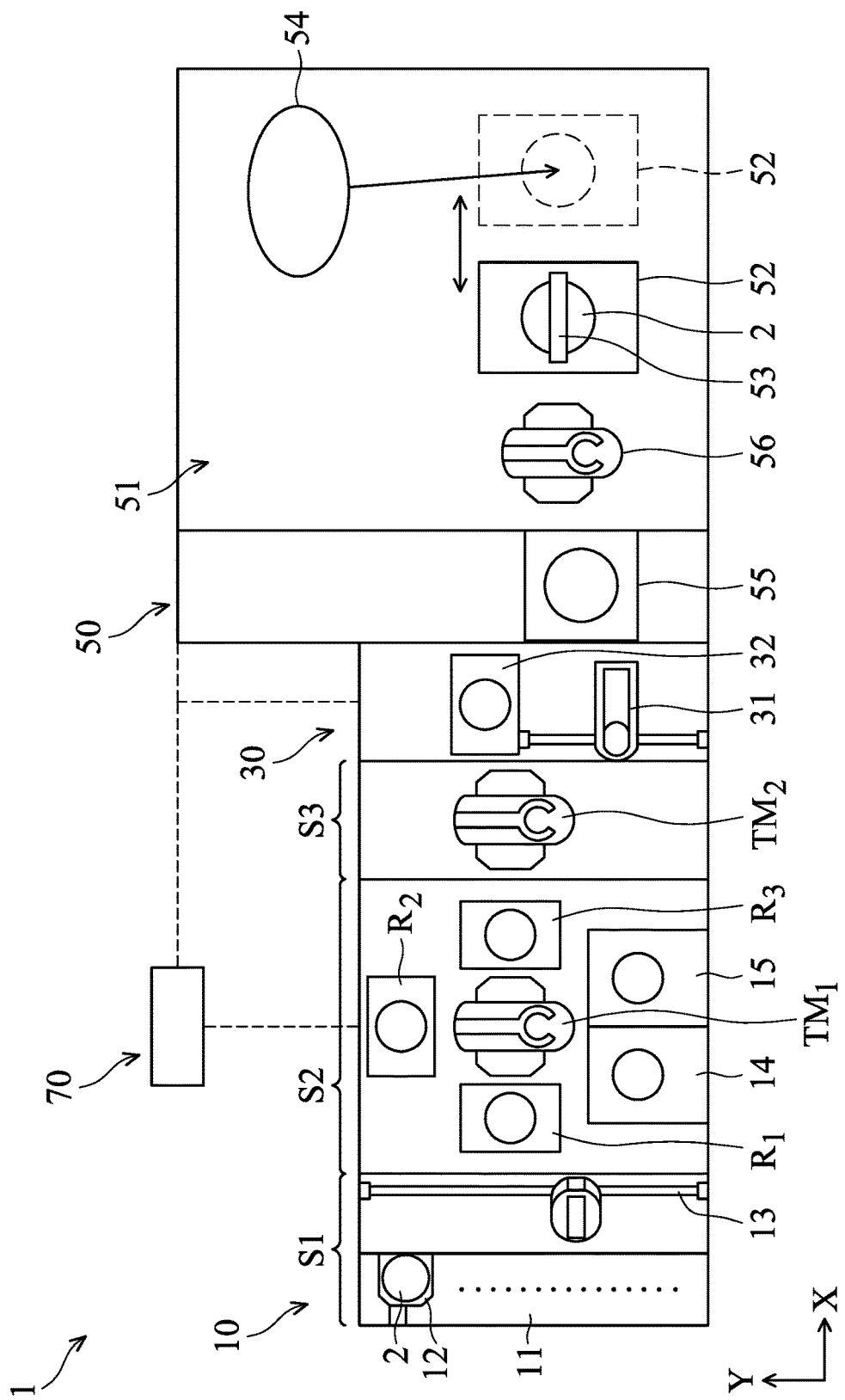
FIG. 1 is a schematic and diagrammatic view of a lithographic system 1, in accordance with some embodiments.

The following disclosure provides many different embodiments, or examples, for implementing different features of the subject matter provided. Specific examples of solutions and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship apparatus to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

The advanced lithography process, method, and materials described in the current disclosure can be used in many applications, including fin-type field effect transistors (FinFETs). For example, the fins may be patterned to produce a relatively close spacing between features, for which the above disclosure is well suited. In addition, spacers used in forming fins of FinFETs can be processed according to the above disclosure.

Since lithography exposing process is sensitive to the topographic heights of the target layer being exposed, if the depth of focus (DOF) or focal length of the lithographic system is not adjusted according to the topographic heights of the target layer, the photoresist layer cannot be properly exposed. This problem may become more and more serious with the use of higher numerical aperture (NA) processes. Furthermore, the challenges of understanding the topography of the target layer increase because lithographic systems require strict environments for the target substrate (e.g., vacuum, etc.) The disclosure provides a lithographic system which determines a focal length for exposing the photoresist layer by two stages measurements implantation so as to improve the product yield of the semiconductor wafer manufactured by the lithographic system.

FIG. 1 is a schematic and diagrammatic view of a lithographic system 1, in accordance with some embodiments. In some embodiments, the lithographic system 1 includes a track apparatus 10, an interface apparatus 30, an exposure apparatus 50, and a controlling apparatus 70. It is appreciated that the features described below can be replaced or eliminated in other embodiments of the lithographic system 1.

In some embodiments, the track apparatus 10 includes a cassette station S1, a processing station S2 (performs substrate processes such as a photoresist coating process, a developing process) and a transferring station S3 arranged in order.

In some embodiments, the cassette station S1 includes a cassette stage 11, a cassette 12, and a transfer mechanism 13. The cassette stage 11 is a holding portion that holds wafer cassettes (hereinafter referred to as cassettes) that are for example four substrate cassettes. Each cassette 12 contains a plurality of the semiconductor wafer 2. Each cassette 12 is placed on the cassette stage 11. The transfer mechanism 13 is a transferring portion that transfers the semiconductor wafer 2 to and from the processing station S2. The transfer mechanism 13 is structured so that it can be elevated, moved in the X and Y directions, and rotated around the vertical axis.

In some embodiments, the processing station S2 is located between the cassette station S1 and the transferring station S3. The processing station S2 transfers the semiconductor wafer 2 between the cassette station S1 and the transferring station S3.

In some embodiments, the processing station S2 is configured to carry out a photoresist coating process and a developing process, and the processing station S2 includes a coating chamber 14, a developing chamber 15, three stacks $R_1$, $R_2$, and $R_3$ and a transfer mechanism $TM_1$.

The stack $R_1$, the stack $R_2$, and the stack $R_3$, the coating chamber 14 and the developing chamber 15 are consecutively positioned around the transfer mechanism $TM_1$. The transfer mechanism $TM_1$ may be elevated, moved leftward and rightward, moved forward and backward, and rotated around the vertical axis so as to transfer the semiconductor wafer 2 among the coating chamber 14, the developing chamber 15, and the stacks $R_1$, $R_2$ and $R_3$.

In some embodiments, each of the stacks $R_1$ and $R_2$ includes a number of shelves adapted to carry out a pre-treatment and/or post-treatment for the treatment to be performed in the developing chamber 15 and/or the coating chamber 14. For example, the stacks $R_1$ and $R_2$ may include a shelf having a heating unit (CLHP, not shown in figures) adapted to heat each wafer 5 after subjected to the photoresist coating process. The stacks $R_1$ and $R_2$ may also include a shelf having a post-exposure baking unit (PEB, not shown in figures) adapted to heat each wafer after subjected to a lithography exposing process. The stacks $R_1$ and $R_2$ may further include a post-baking unit (POST, not shown in figures) adapted to perform a heating process to vaporize moisture on each wafer 5 after the developing process.

Figure 2:
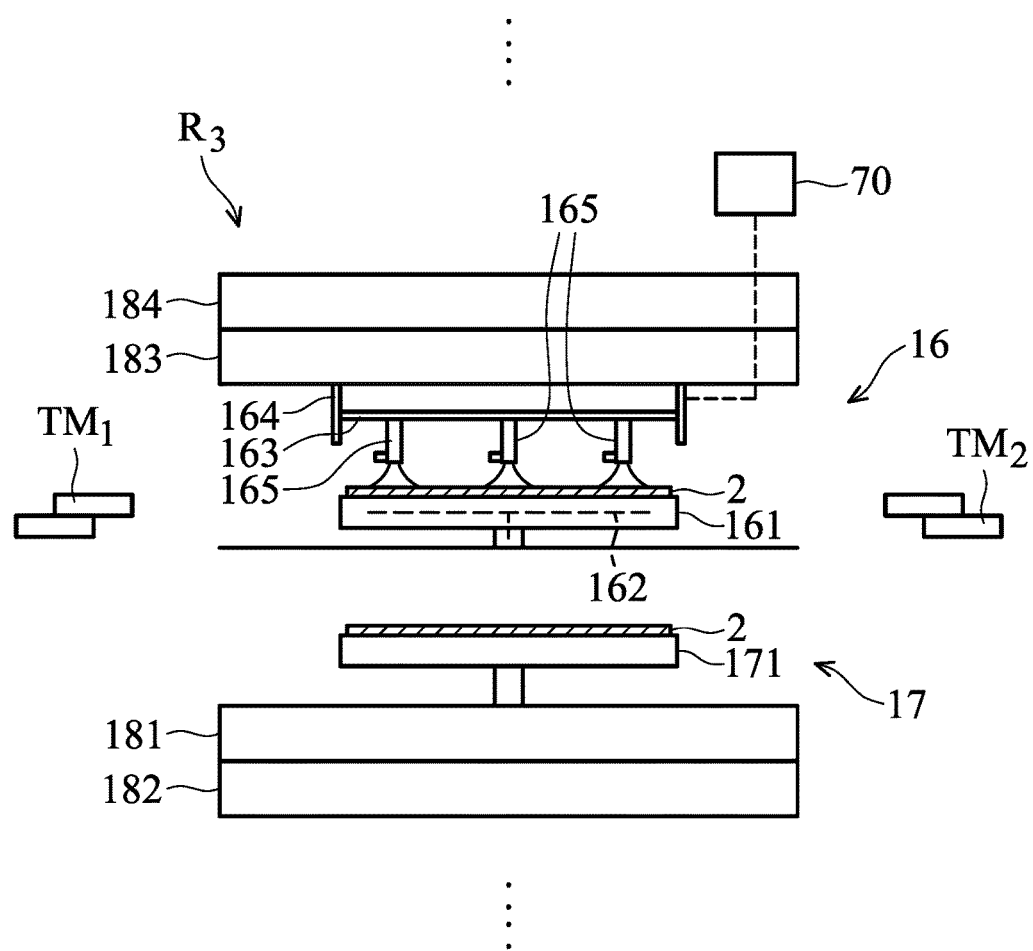
FIG. 2 is a schematic and diagrammatic view of a stack, in accordance with some embodiments.

In some embodiments, the stack $R_3$ is provided in a position where both the transfer mechanism $TM_1$ and the transfer mechanism $TM_2$ can access. As shown in FIG. 2, the stack $R_3$ includes a number of shelves adapted to transfer the semiconductor wafer 2 from the transfer mechanism $TM_1$ to the transfer mechanism $TM_2$ or to transfer the semiconductor wafer 2 from the transfer mechanism $TM_2$ to the transfer mechanism $TM_1$.

For example, the stack $R_3$ shown in FIG. 2 includes a first transfer shelf 16 and a second transfer shelf 17. The first transfer shelf 16 includes a cooling plate 161 on which the semiconductor wafer 2 is transferred from the transfer mechanism $TM_1$ to the transfer mechanism $TM_2$. In some embodiments, at least one cooling channel 162 is provided in the cooling plate 161 for circulating a coolant through the cooling plate 161 so as to cool the semiconductor wafer 2 placed thereon. On the other hand, the second transfer shelf 17 includes a transferring table 171 on which the semiconductor wafer 2 is transferred from the transfer mechanism $TM_2$ to the transfer mechanism $TM_1$.

In some embodiments, the cooling shelf 16 further includes a frame 163 and an actuator 164 and one or more air gauge tools 165. The frame 163 is positioned over the cooling plate 161 and connected to the actuator 164. The actuator 164 is configured to control the movement of the frame 163 in horizontal directions (i.e., the X-axis direction and the Y-axis direction). The actuator 164 may be electronically connected to the controlling apparatus 70 and is controlled to drive the movement of the frame 163 according the signals issued by the controlling apparatus 70.

The air gauge tools 165 are configured for measuring the topographic height of the semiconductor wafer 2 and providing a determination on the topology (e.g., level) of the semiconductor wafer 2 or any portion thereof. In some embodiments, the air gauge tools 165 are positioned on the frame 163. Each of the air gauge tools 165 are spaced apart from one the other by a predetermined distance. The air gauge tools 165 discharge a gas locally onto a surface of the semiconductor wafer 2 and detect a variation in the pressure of the gas.

The air gauge tools 165 determine a height of the wafer surface as a function of the variation in pressure. The air gauge tools 165 may be electrically connected to the controlling apparatus 70. The measurements from the air gauge tools 165 are transmitted to the controlling unit 70 for determining one or more process parameters for the exposure apparatus 50.

It should be appreciated that the number of air gauge tools 165 should not be limited to the embodiments shown in FIG. 2 and may vary based upon the number of regions to be measured on the semiconductor wafer 2 at the one time. In addition, the number of the shelves in the stack $R_3$ should not be limited to the embodiments and may vary according to number of the treatments to be performed in the lithographic process.

For example, as shown in FIG. 2, the stack $R_3$ further includes a number of shelves 181, 182, 183 and 184. The shelves 181 and 182 are positioned below the shelf 17, and the shelves 183 and 184 are positioned above the shelf 16. The shelves 181, 182, 183 and 184 may include a cooling plate for a cooling process after a post exposure baking (PEB) process. Alternatively, the shelves 181, 182, 183 and 184 may include a table for temporarily store a semiconductor wafer 2. Alternatively, the shelves 181, 182, 183 and 184 may be the same as the shelf 16 or shelf 17.

Referring back to FIG. 1, the transferring station S3 is located between the processing station S2 and the interface apparatus 30. The transferring station S3 has a transfer mechanism $TM_2$. The transfer mechanism $TM_2$ may be elevated, moved leftward and rightward, moved forward and backward, and rotated around the vertical axis so as to transfer the semiconductor wafer 2 between the processing station S2 and the interface apparatus 30.

The interface apparatus 30 is located between the track apparatus 10 and the exposure apparatus 50. The interface apparatus 30 has the transfer mechanism 31 and a transfer table 32 on which the semiconductor wafer 2 is transferred from the transfer mechanism $TM_1$ to the transfer mechanism 31. The transfer mechanism 31 may be elevated, moved leftward and rightward, moved forward and backward, and rotated around the vertical axis so as to transfer the semiconductor wafer 2 between the table 32 and the exposure apparatus 50.

The exposure apparatus 50 is configured to use a high-brightness light to expose a photoresist layer coated on the semiconductor wafer 2. The exposure apparatus 50 may be generically referred to as a scanner that is operable to perform lithography exposing process with respective radiation source and exposure mode. In some embodiments, the exposure apparatus 50 includes an exposure chamber 51, a wafer stage 52, an optical measurement tool 53, an exposure tool 54, the load lock chamber 55 and a transfer mechanism 56.

The exposure chamber 51 preserves a vacuum environment at an ultra-high vacuum pressure. The wafer stage 52, the optical measurement tool 53 and the exposure tool 54 are positioned in the exposure chamber 51. The wafer stage 52 is configured for supporting the semiconductor wafer 2. In some embodiments, the wafer stage 52 is positioned in the exposure chamber 51 and moveable between a leveling position (indicated by solid lines) and an exposure position (indicated by dotted lines) by a driving member, such as linear motor (not shown in figures). A radial and rotational movement of the wafer stage 52 can be coordinated or combined in order to transfer, and deliver the semiconductor wafer 2.

Figure 3:
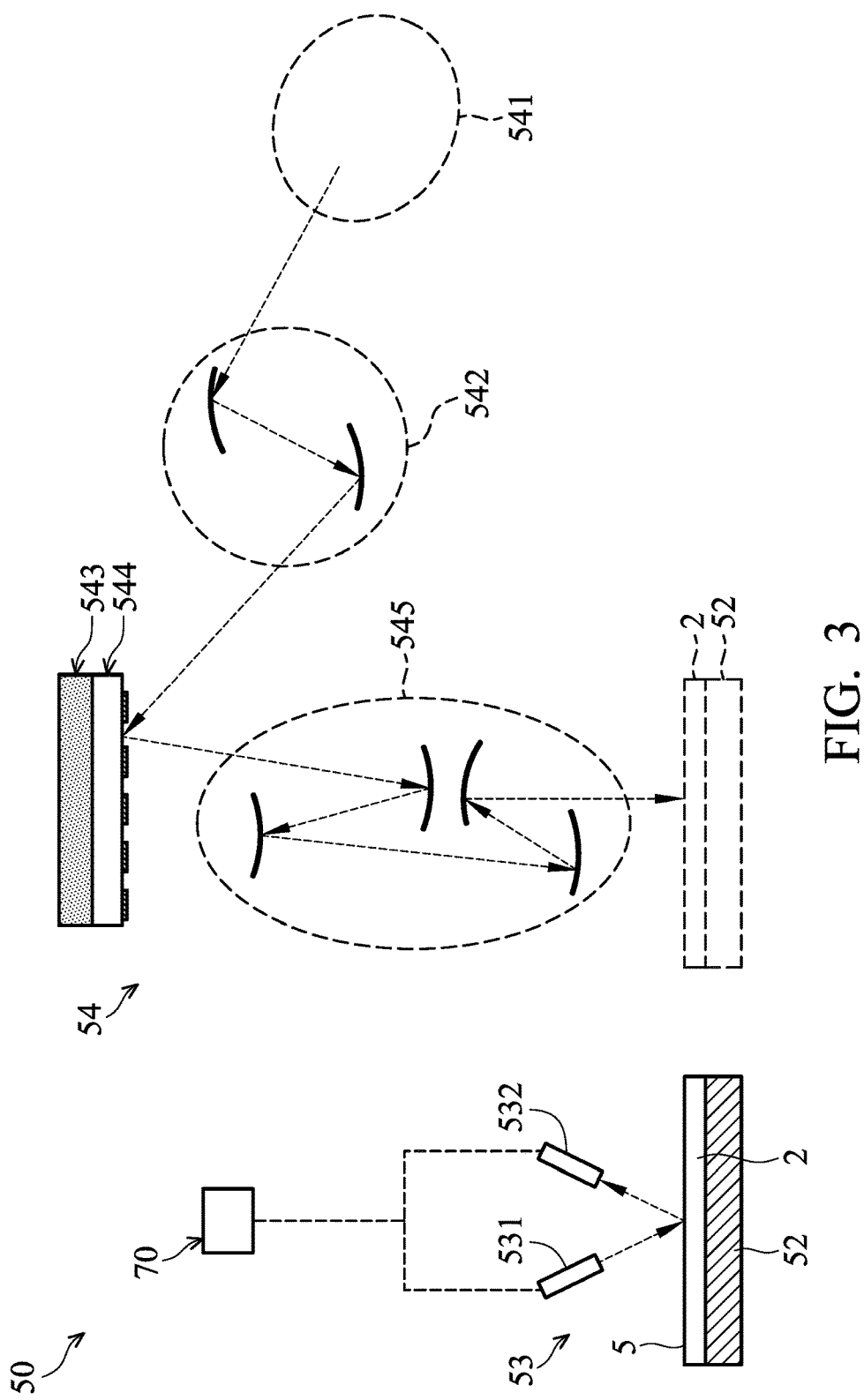
FIG. 3 shows a schematic and diagrammatic view of an exposure tool, in accordance with some embodiments.

FIG. 3 shows a schematic view of the exposure tool 54, in accordance with some embodiments. The optical measurement tool 53 is configured for measuring the topographic height of the semiconductor wafer 2 and providing a determination on the topology (e.g., level) of the semiconductor wafer 2 or any portion thereof. The optical measurement tool 53 is positioned over the wafer stage 52 when the wafer stage 52 is positioned in the leveling position.

In some embodiments, the optical measurement tool 53 includes a transducer 531 and a collector 532. The transducer 531 is configured to emit a focused incident beam of radiation to the surface of the semiconductor wafer 2. The incident beam is reflected off the surface of the semiconductor wafer 2 and is received by the collector 532. The optical measurement tool 53 determines the height of the wafer surface as a function of position from the incident and reflected beams of radiation. The optical measurement tool 53 may be electrically connected to the controlling unit 70 (FIG. 1). The measurements from the optical measurement tool 53 are transmitted to the controlling unit 70 for determining one or more process parameters for the exposure apparatus 50.

The exposure tool 54 is configured to apply a radiation beam including a pattern in the beam's cross-section onto the surface of the semiconductor wafer 2 so as to print desired patterns over a photoresist layer coated on the semiconductor wafer 2. The exposure tool 54 is positioned over the wafer stage 52 when the wafer stage 52 is positioned in the exposure position. The technical features of the exposure tool 54, according to some embodiments, are described below.

The exposure tool 54 is configured to supply a high-brightness light to expose a photoresist layer coated on the semiconductor wafer 2. In some embodiments, the exposure tool 54 includes a high-brightness light source 541, an illuminator 542, a mask stage 543, a mask 544, and a projection optics module (or projection optics box (POB)) 545.

The high-brightness light source 541 is an EUV source which generates an EUV light with a wavelength centered at about 13.5 nm. However, it should be appreciated that the high-brightness light source 541 should not be limited to emitting EUV light. The high-brightness light source 541 may include a radiation source, such as an ultraviolet (UV) source or a deep ultra-violet (DUV) source.

In some embodiments, the illuminator 542 includes various refractive optic components, such as a single lens or a lens system having multiple lenses (zone plates) or alternatively reflective optics (for EUV lithography system), such as a single mirror or a mirror system having multiple mirrors in order to direct light from the high-brightness light source 541 onto the mask stage 543, particularly to a mask 544 secured on the mask stage 543. In the present embodiment where the high-brightness light source 541 generates light in the EUV wavelength range, reflective optics is employed.

The mask stage 543 is configured to secure the mask 544. In some embodiments, the mask stage 543 includes an electrostatic chuck (e-chuck) to secure the mask 544. In the present embodiment, the mask 544 is a reflective mask and includes a multiple reflective multiple layers (ML) deposited on a substrate so as to highly reflect the EUV light.

The projection optics module (or projection optics box (POB)) 545 is configured for imaging the pattern of the mask 544 on to the semiconductor wafer 2 secured on the wafer stage 52 of the exposure apparatus 50. In some embodiments, the POB 545 has refractive optics (such as for a UV lithography system) or alternatively reflective optics (such as for an EUV lithography system) in various embodiments. The light directed from the mask 544, carrying the image of the pattern defined on the mask, is collected by the POB 545. The illuminator 542 and the POB 545 are collectively referred to as an optical module of the exposure apparatus 50.

In some embodiments, the exposure apparatus 50 further includes a number of actuators (not shown in the figures) connected to the illuminator 542 and the POB 545 to adjust the position of optic elements of the illuminator 542 and the POB 545. The actuators are electrically connected to the controlling apparatus 70. In addition, the actuator is controlled to drive the movement of the optic elements of the illuminator 542 and the POB 545 according the signals issued by the controlling apparatus 70. As a result, the focal length of the radiation scanned over the semiconductor wafer 2 can be adjusted.

Referring back to FIG. 1, in some embodiments, the load lock chamber 55 is arranged between the exposure chamber 51 and the interface apparatus 30. The load lock chamber 55 is configured for preserving the atmosphere within the exposure chamber 51 by separating it from the interface apparatus 30. The load lock chamber 55 is capable of creating an atmosphere compatible with the exposure apparatus 50 or the interface apparatus 30 depending on where the loaded the semiconductor wafer 2 is scheduled to be next. This can be performed by altering the gas content of the load lock chamber 55 by such means as adding gas or creating a vacuum, along with other suitable means for adjusting the atmosphere in the load lock chamber 55. When the correct atmosphere has been reached, the semiconductor wafer 2 can be accessed by the transfer mechanism 31 or 56.

In some embodiments, the controlling apparatus 70 includes an information handling system such as a computer, server, workstation, or another suitable device and is electrically connected to all elements of the lithographic system 1 to perform one or more steps of the methods and/or functions of the systems described herein.

For example, the controlling apparatus 70 is electrically connected to the air gauge tools 165 and the optical measurement tool 53 and receives a signal in relation to the height of the semiconductor wafer 2 from the air gauge tools 165 and the optical measurement tool 53. In addition, the controlling apparatus 70 is electrically connected to the illuminator 542 and the POB 545 of the exposure tool 54 so as to control the focal length of the radiation used for exposing the photoresist layer.

Figure 4:
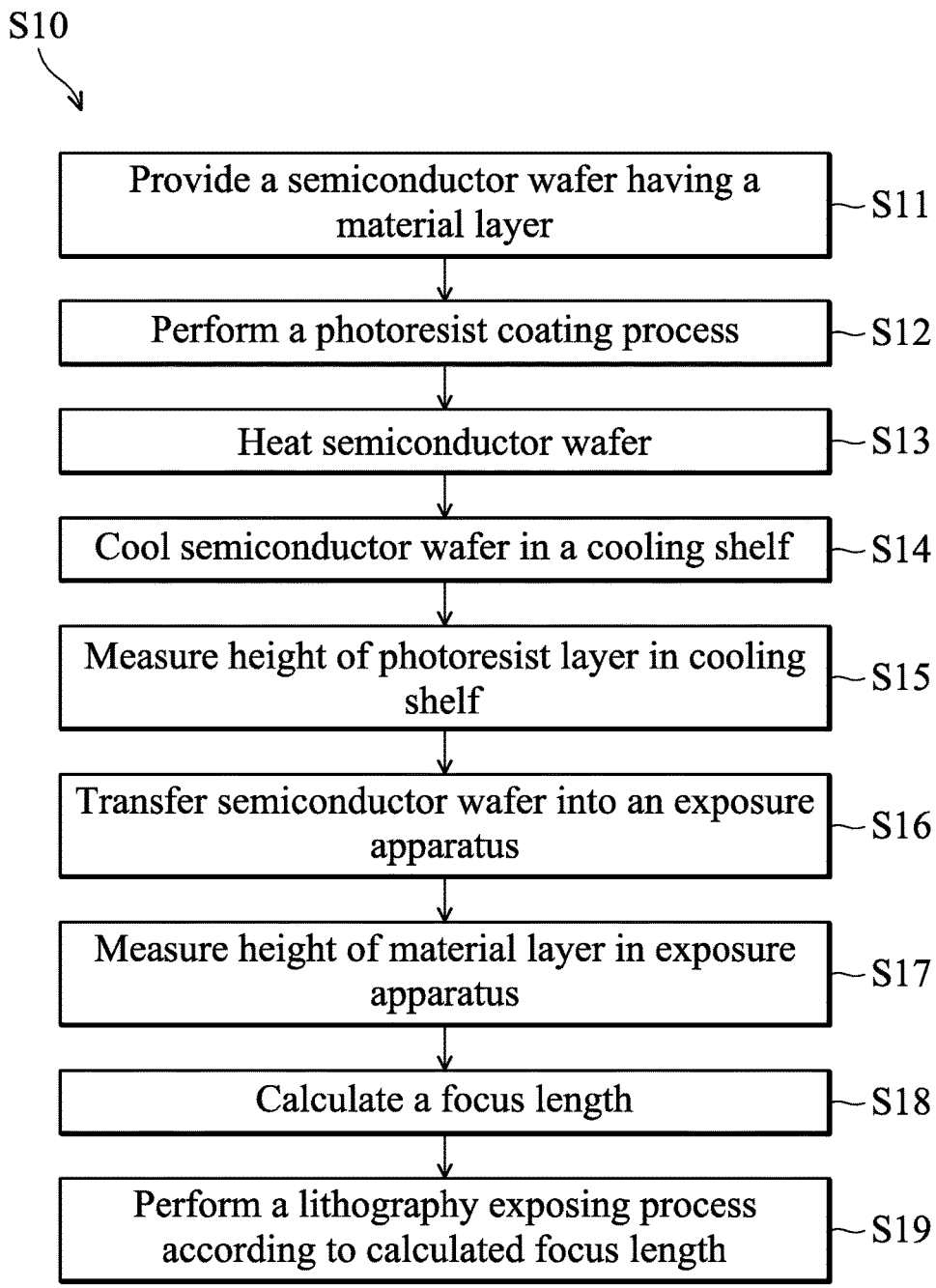
FIG. 4 is a flowchart of a method for performing a lithographic process over a semiconductor wafer, in accordance with some embodiments.

FIG. 4 is a flow chart illustrating a method S10 for performing a lithographic process on the semiconductor wafer 2, in accordance with some embodiments. For illustration, the flow chart of FIG. 4 will be described along with the schematic views shown in FIGS. 1-3 and 5-7. Some of the stages described can be replaced or eliminated for different embodiments.

Figure 5:
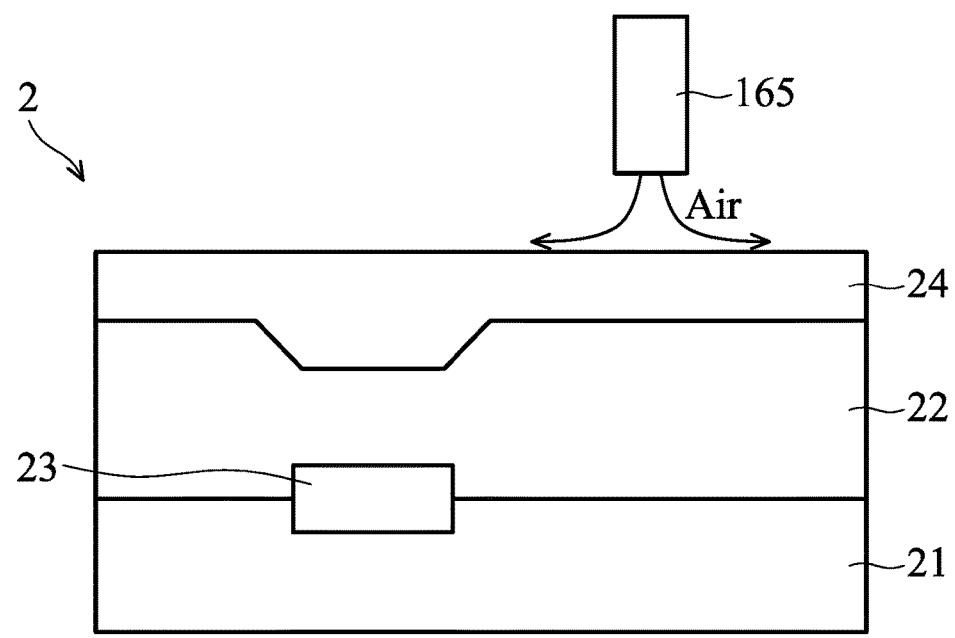
FIG. 5 shows a schematic view of one stage of a method for performing a lithographic process as a height of a photoresist layer is measured by an air gauge tool, in accordance with some embodiments.

The method S10 includes operation S11, in which a semiconductor wafer 2 is provided. In some embodiments, as shown in FIG. 5, the semiconductor wafer 2 includes a substrate 21, a material layer 22 and a gate electrode 23. In some embodiments, the substrate 21 is a bulk semiconductor substrate, such as a semiconductor wafer. For example, the substrate 21 is a silicon wafer. The substrate 21 may include silicon or another elementary semiconductor material such as germanium. In some other embodiments, the substrate 21 includes a compound semiconductor. The compound semiconductor may include gallium arsenide, silicon carbide, indium arsenide, indium phosphide, another suitable material, or a combination thereof.

In some embodiments, the substrate 21 includes a semiconductor-on-insulator (SOI) substrate. The SOI substrate may be fabricated using a separation by implantation of oxygen (SIMOX) process, a wafer bonding process, another applicable method, or a combination thereof.

In some embodiments, the substrate 21 is an un-doped substrate. However, in some other embodiments, the substrate 21 is a lightly doped substrate such as a lightly doped first conductive type substrate. In some embodiments, when the first conductive type is P-type, the substrate 21 is a lightly doped P-type substrate. The gate electrode 23 is formed on the substrate 21.

The material layer 22 is formed on the substrate 21 and covers the gate electrode 23. The material layer 22 may include a bottom anti-reflective coating (BARC) layer. The material layer 22 is deposited on substrate 21 as a thin layer, typically from about 200 angstroms to about 2000 angstroms, depending on the type of ARC and material (organic vs. inorganic) used. The material layer 22 also acts as part of the photoresist mask and along with photoresist layer 24 (which will be described later) will be subsequently removed after the completion of the lithography exposing process step.

The method S10 includes operation S12, in which a photoresist coating process is performed. In some embodiments, a photoresist layer 24, as shown in FIG. 5, is formed over the material layer 22. The controlling apparatus 70 initiates a dispensing of the photoresist over the semiconductor wafer 2 when the semiconductor wafer 2 is placed in the coating chamber (FIG. 1).

The photoresist layer 24 is a radiation (e.g., light) sensitive material and may be a positive tone resist (PTD) or negative tone resist (NTD). A positive tone resist (or simply positive resist) is a type of photoresist in which the portion of the photoresist that is exposed to light becomes soluble to the photoresist developer. The portion of the photoresist that is unexposed remains insoluble to the photoresist developer. A negative tone resist (or simply negative resist) is a type of photoresist in which the portion of the photoresist that is exposed to light becomes insoluble to the photoresist developer. The unexposed portion of the photoresist is dissolved by the photoresist developer. The photoresist layer 24 may include an organic polymer (e.g., positive tone or negative tone photoresist polymer), an organic-based solvent, and/or other suitable components known in the art.

The method S10 includes operation S13, in which the semiconductor wafer 2 coated with the photoresist layer 24 is heated. In some embodiments, a soft baking is performed. In some embodiments, the soft baking is performed for a period of time between about 60 seconds and about 90 seconds. The temperature of the semiconductor wafer 2 and photoresist layer 24 may be between about 75° C. and about 135° C., and may also be between about 90° C. and about 110° C. During the soft baking, some substances that are easy to evaporate, such as the solvent therein, are evaporated from the photoresist layer 24. Operation S13 may be performed in the stack $R_1$ or $R_2$ (FIG. 1).

The method S10 includes operation S14, in which the semiconductor wafer 2 is cooled in the cooling shelf 16. In some embodiments, after the completion of operation S13, the semiconductor wafer 2 is transferred to the cooling shelf 16 and placed on the cooling plate 161 on which the temperature of the semiconductor wafer 2 is taken away by the coolant passing through the cooling plate 161. The air pressure in the cooling shelf 16 may be at an ambient pressure, such as one atmosphere, although the ambient pressure may be higher or lower than one atmosphere.

The method S10 includes operation S15, in which the height of the photoresist layer 24 is measured. In some embodiments, as shown in FIG. 5, the height of the photoresist layer 24 is measured by the air gauge tools 165 (only one air gauge tool is shown in FIG. 5) positioned over the cooling plate 161. The air gauge tools 165 measures a relative or absolute height of the outermost surface (comprising the photoresist layer in this example) of the semiconductor wafer 2 at a given region or entire surface. The height of the material layer 22 is equaled to a distance from a front surface of the photoresist layer 24 to the backside surface of the substrate 21.

The height measurements may include a number of coordinates on the semiconductor wafer 2. For example, each of the air gauge tools 165 provides a height measurement at coordinate in the region. The height measurements from the air gauge tools 165 are transmitted to the controlling apparatus 70.

In some embodiments, during operation S15, the frame 163 on which the air gauge tools 165 positioned are moved parallel to the cooling plate 161 (i.e. in the horizontal directions) so as to move the air gauge tools 165 to measure the height of the photoresist layer 24 in different positions. For example, the controlling apparatus 70 controls the movement of the frame 163 to move along a straight line in a step mode. While at the same time, the air gauge tools 165 measure the height of the photoresist layer 24 located below when the frame 163 is stopped. As a result; topographical height of a number of stripe regions parallel to one another are measured by the air gauge tools 165.

In some embodiments, operation S14 and operation S15 are performed simultaneously. In some embodiments, operation S14 and operation S15 are initiated at the same time, but operation S14 is finished before operation S15. In some embodiments, operation S15 is finished before the initiated of operation S16. Namely, the height of the photoresist layer is measured before removal of the semiconductor wafer from the track apparatus 10.

The method S10 includes operation S16, in which the semiconductor wafer 2 is transferred into the exposure apparatus 50. In some embodiments, the controlling apparatus 70 is configured for controlling the interface apparatus 30 to transfer the semiconductor wafer 2 from the cooling shelf 16 to the load lock chamber 55 via the transfer mechanism $TM_2$, the transfer table 32 and the transfer mechanism 31. After the semiconductor wafer 2 is positioned in the load lock chamber 55, the pressure in the load lock chamber 55 is adjusted to a pressure compatible with the exposure chamber 51. When the correct pressure has been reached, the semiconductor wafer 2 is accessed by the transfer mechanism 56 and moved to the wafer stage 52 which is located at the leveling position.

Figure 6:
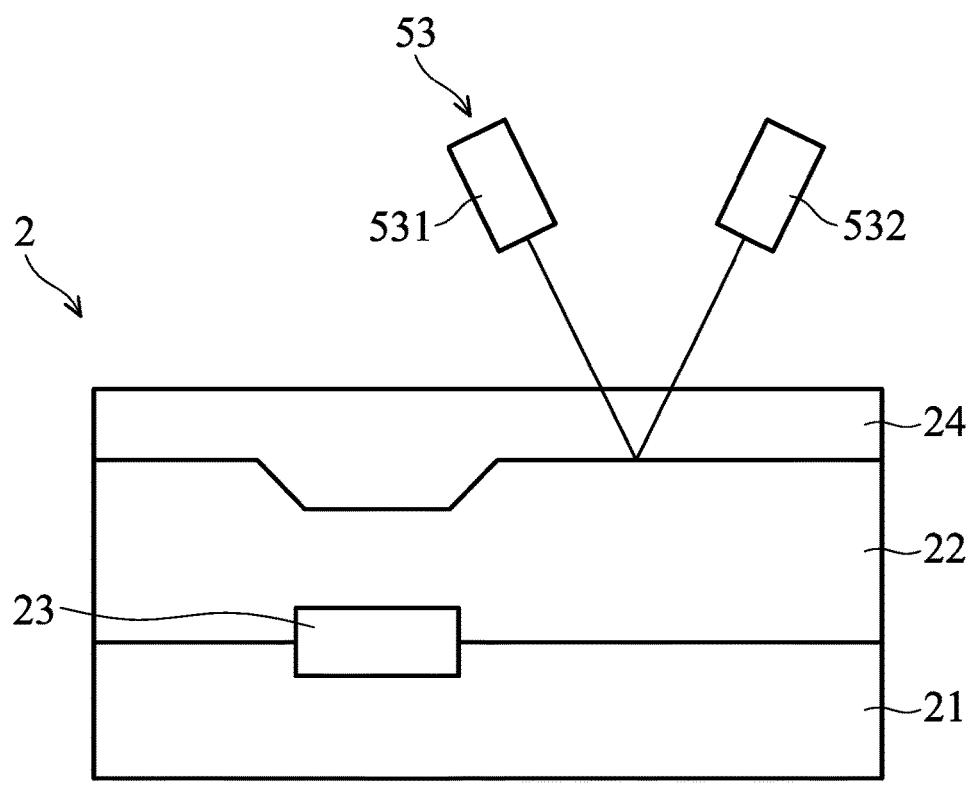
FIG. 6 shows a schematic view of one stage of a method for performing a lithographic process as the height of a material layer is measured by an optical measurement tool, in accordance with some embodiments.

The method S10 includes operation S17, in which the height of the material layer 22 is measured. In some embodiments, as shown in FIG. 6, since the photoresist layer 24 on the semiconductor substrate 2 are (partially) transparent, an incident beam from the transducer 531 is refracted into the photoresist layer 24, and reflected on the interface between the photoresist layer 24 and the material layer 22. At the surface of the photoresist layer 24 this beam is again refracted and forms a beam which is received by the collector 532 for analysis. The optical measurement tool 53 measures the height of the material layer 22 according to the position of the refracted beam. The height of the material layer 22 is equaled to a distance from a front surface of the material layer 22 to the backside surface of the substrate 21.

Figure 7:
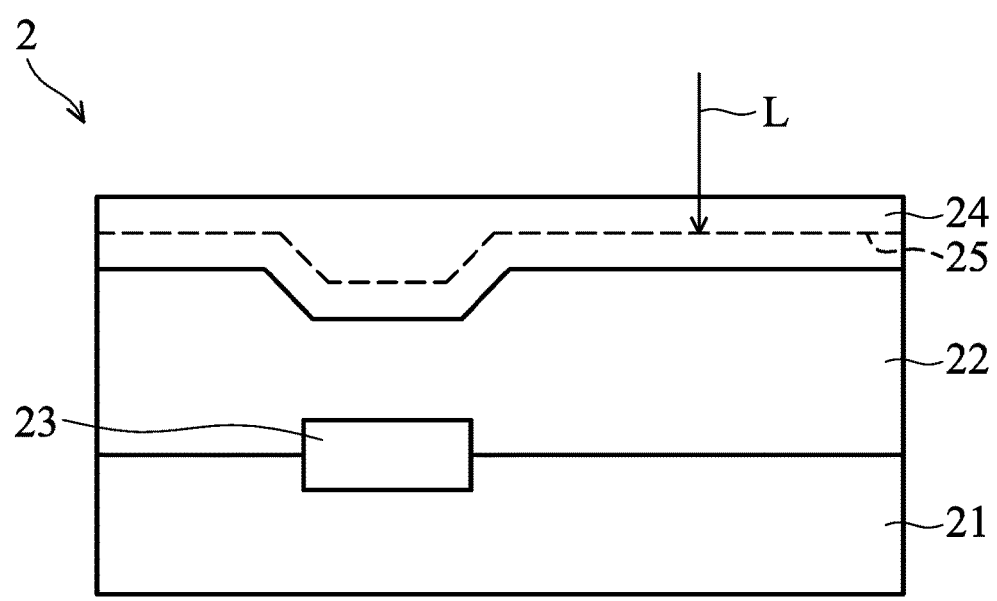
FIG. 7 shows a schematic view of one stage of a method for performing a lithographic process as a photoresist layer is exposed by a radiation beam, in accordance with some embodiments.

The method S10 includes operation S18, in which a depth of focus (DOF) or a focal length is calculated. In an embodiment, the controlling apparatus 70 determines a topography map based on a received height of the semiconductor wafer 2 from the optical measurement tool 53 and the air gauge tools 165. In addition, the topography map provides one or more parameters to be used for a lithography exposing process for each of a plurality of points on the semiconductor wafer 2. For example, in an embodiment, the topography map specifies a focal length to be applied to expose an exposure field of the semiconductor wafer 2. The controlling apparatus 70 may determine a focus plane 25, as shown in FIG. 7, by calculating a mean value of the height of the photoresist layer and the height of the material layer for exposure the photoresist layer 24.

The method S10 includes operation S19, in which a lithography exposing process is performed. In an embodiment, the semiconductor wafer 2 is exposed using a lithography exposing process. As shown in FIG. 7, the radiation beam with the calculated focal length is incident on the focus plane 25 in the semiconductor wafer 2 to expose a pattern of a circuit feature or portion thereof in the exposure field (e.g., portion of substrate exposed to radiation).

In particular, the focal length of the radiation beam incident on the substrate is defined in part by the illuminator 542 and the POB 545. The illuminator 542 and the POB 545 may allow the focal length of a radiation beam of the exposure tool 54 to be adjusted during the lithography exposing process. For example, the illuminator 542 and the POB 545 provide one or more different focal lengths within a lithography exposing process for a given substrate. In an embodiment, the illuminator 542 and the POB 545 allows the provision of one or more different focal lengths within a lithography exposing process for a given exposure field on a substrate. Alternatively, the focal length provided by an exposure apparatus is adjusted by additional manners, such as in adjustment of positioning of the semiconductor wafer 2.

The method S10 may further include other operations, such as an operation to perform a fabrication process to the semiconductor wafer 2 through the openings of the resist pattern. In one example, the fabrication process includes an etch process to the semiconductor wafer 2 using the resist pattern as an etch mask in the developing chamber 15 of the track apparatus 10. In another example, the fabrication process includes an ion implantation process to the semiconductor wafer 2 using the resist pattern as an implantation mask.

Embodiments of methods and devices allow for compensation in parameters used during the lithography exposing process based on the measured height of the layers. A first stage and a second stage of the height measurement are conducted at a track apparatus and an exposures apparatus, respectively. Therefore, the waiting time for the height measurement is reduced, and the throughput of the semiconductor wafer is increased. In addition, the problem that an air gauge tool cannot be utilized in EUV exposure apparatus due to vacuum pressure can be solved. On the other hand, since the height measured at the second stage can be calibrated by the height measured at the first stage, the photoresist layer on the semiconductor wafer can be exposed by suitable lithography parameter such as focal length, and the product yield is improved accordingly.

In accordance with some embodiments, a method for performing a lithographic process over a semiconductor wafer is provided. The semiconductor wafer includes a substrate, a material layer and a photoresist layer. The material layer is disposed over the substrate, and the photoresist layer is disposed over the material layer. The method includes measuring a height of the photoresist layer at an ambient pressure. The method further includes measuring a height of the material layer in a vacuum pressure. The method also includes determining a focal length for exposing the semiconductor wafer according to the height of the photoresist layer and the height of the material layer.

In accordance with some embodiments, a method for performing a lithographic process over a semiconductor wafer is provided. The method includes coating a photoresist layer over a material layer which is formed on the semiconductor wafer in a track apparatus. The method further includes transferring the semiconductor wafer from the track apparatus to an exposure apparatus. The method also includes measuring a height of the photoresist layer before removal of the semiconductor wafer from the track apparatus. In addition, the method includes measuring a height of the material layer in the exposure apparatus. The method includes determining a focal length for exposing the semiconductor wafer according to the height of the photoresist layer and the height of the material layer.

In accordance with some embodiments, a lithographic system for processing a semiconductor wafer is provided. The semiconductor wafer includes a substrate, a material layer and a photoresist layer. The material layer is disposed over the substrate, and the photoresist layer is disposed over the material layer. The lithographic system includes a track apparatus. The track apparatus includes a cooling plate and an air gauge tool positioned over the cooling plate. The lithographic system further includes an exposure apparatus. The exposure apparatus includes an exposure chamber, an exposure tool, and an optical measurement tool. The exposure tool and the optical measurement tool are positioned in the exposure chamber. The lithographic system also includes a controlling apparatus. The controlling apparatus is configured for controlling the air gauge tool to measure a height of the photoresist layer of the semiconductor wafer. The controlling apparatus is further configured for controlling the optical measurement tool to measure a height of the material layer of the semiconductor wafer. The controlling apparatus is also configured for adjusting a focal length of a radiation generated by the exposure tool according to the height of the photoresist layer and the height of the material layer.

Although the embodiments and their advantages have been described in detail, it should be understood that various changes, substitutions, and alterations can be made herein without departing from the spirit and scope of the embodiments as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method for performing a lithographic process over a semiconductor wafer comprising a substrate, a material layer disposed over the substrate and a photoresist layer disposed over the material layer, the method comprising:
   measuring a height of the photoresist layer at an ambient pressure;
   measuring a height of the material layer in a vacuum pressure; and
   determining a focal length for exposing the semiconductor wafer according to the height of the photoresist layer and the height of the material layer.

2. The method as claimed in claim 1, wherein the measurement of the height of the photoresist layer is performed by an air gauge tool, wherein the air gauge tool discharges a gas onto a surface of the photoresist layer and detects a variation in a pressure of the gas.

3. The method as claimed in claim 1, wherein the measurement of the height of the material layer is performed by an optical measurement tool, wherein the optical measurement tool emits an incident beam of radiation to a surface of the material layer and receives the incident beam reflected from the surface of the material layer.

4. The method as claimed in claim 1, further comprising:
   placing the semiconductor wafer on a cooling plate positioned in a cooling shelf which is at the ambient pressure; and
   cooling the semiconductor wafer, wherein the measurement of the height of the photoresist layer is performed while the semiconductor wafer is cooled by the cooling plate.

5. The method as claimed in claim 4, further comprising:
   dispensing the photoresist layer over the material layer;
   heating the semiconductor wafer coated with the photoresist layer; and
   sending the heated semiconductor wafer into the cooling shelf.

6. The method as claimed in claim 1, wherein the focal length is determined by calculating a mean value of the height of the photoresist layer and the height of the material layer.

7. The method as claimed in claim 1, wherein the vacuum environment is defined in an exposure apparatus for performing an Extreme Ultraviolet (EUV) lithography exposing process.

8. A method for performing a lithographic process over a semiconductor wafer, comprising:
   coating a photoresist layer over a material layer which is formed on the semiconductor wafer in a track apparatus;
   transferring the semiconductor wafer from the track apparatus to an exposure apparatus;
   measuring a height of the photoresist layer before removal of the semiconductor wafer from the track apparatus;
   measuring a height of the material layer in the exposure apparatus; and
   determining a focal length for exposing the semiconductor wafer according to the height of the photoresist layer and the height of the material layer.

9. The method as claimed in claim 8, wherein the measurement of the height of the photoresist layer is performed by an air gauge tool, wherein the air gauge tool discharges a gas onto a surface of the photoresist layer and detects a variation in the pressure of the gas.

10. The method as claimed in claim 8, wherein the measurement of the height of the material layer is performed by an optical measurement tool, wherein the optical measurement tool emits an incident beam of radiation to a surface of the material layer and receives the incident beam reflected from the surface of the material layer.

11. The method as claimed in claim 8, further comprising:
    placing the semiconductor wafer coated with the photoresist layer in a cooling plate positioned in a cooling shelf which is located in the track apparatus;
    cooling the semiconductor wafer, wherein the measurement of the height of the photoresist layer is performed while the semiconductor wafer is cooled by the cooling plate.

12. The method as claimed in claim 11, further comprising:
    heating the semiconductor wafer coated with the photoresist layer in the track apparatus;
    sending the heated semiconductor wafer into the cooling shelf.

13. The method as claimed in claim 8, wherein the focal length is determined by calculating a mean value of the height of the photoresist layer and the height of the material layer.

14. The method as claimed in claim 8, wherein the semiconductor wafer is subjected to an Extreme Ultraviolet (EUV) lithography exposing process in the exposure apparatus.

15. A lithographic system for processing a semiconductor wafer comprising a substrate, a material layer disposed over the substrate and a photoresist layer disposed over the material layer, the lithographic system comprising:
    a track apparatus comprising:
    a cooling plate; and
    an air gauge tool positioned over the cooling plate;
    an exposure apparatus comprising:
    an exposure chamber;
    an exposure tool positioned in the exposure chamber; and an optical measurement tool positioned in the exposure chamber; and a controlling apparatus configured for:

controlling the air gauge tool to measure a height of the photoresist layer of the semiconductor wafer;

controlling the optical measurement tool to measure a height of the material layer of the semiconductor wafer; and adjusting a focal length of a radiation generated by the exposure tool according to the height of the photoresist layer and the height of the material layer.

16. The lithographic system as claimed in claim 15, wherein pressure in a cooling shelf of the track apparatus where the cooling plate is located is at an ambient pressure, and pressure in the exposure chamber is at an ultra-high vacuum pressure.

17. The lithographic system as claimed in claim 15, wherein the track apparatus further comprises a coating chamber, wherein the controlling apparatus is configured for initiating a dispensing of the photoresist over the semiconductor wafer when the semiconductor wafer is placed in the coating chamber.

18. The lithographic system as claimed in claim 15, wherein the exposure tool comprises an Extreme Ultraviolet (EUV) source.

19. The lithographic system as claimed in claim 15, further comprising:

an interface apparatus positioned between the track apparatus and the exposure apparatus;

wherein the controlling apparatus is configured for controlling the interface apparatus to transfer the semiconductor wafer between the track apparatus and the exposure apparatus.

20. The lithographic system as claimed in claim 15, wherein the track apparatus further comprises another air gauge tool, wherein the controller is configured for simultaneously controlling all of the air gauge tools to measure the height of the photoresist layer at different regions of the semiconductor wafer.

* * * * *